United States Patent [19]

Uno et al.

[11] Patent Number: 5,432,107
[45] Date of Patent: Jul. 11, 1995

[54] SEMICONDUCTOR FABRICATING METHOD FORMING CHANNEL STOPPER WITH DIAGONALLY IMPLANTED IONS

[75] Inventors: Akito Uno; Yopshinori Odake, both of Osaka, Japan

[73] Assignee: Matsushita Electric Industrial Co., Ltd., Kadoma, Japan

[21] Appl. No.: 145,100

[22] Filed: Nov. 3, 1993

[30] Foreign Application Priority Data

Nov. 4, 1992 [JP] Japan .................................. 4-294818

[51] Int. Cl.⁶ ........................................ H01L 21/265
[52] U.S. Cl. .................................. 437/35; 437/52; 437/45
[58] Field of Search .................................. 437/35, 45

[56] References Cited

U.S. PATENT DOCUMENTS

| | | | |
|---|---|---|---|
| 3,873,371 | 3/1975 | Wolf | 437/35 |
| 4,598,460 | 7/1986 | Owens | 437/57 |
| 5,147,811 | 9/1992 | Sakagami | 437/35 |
| 5,240,874 | 8/1993 | Roberts | 437/35 |

Primary Examiner—Brian E. Hearn
Assistant Examiner—Lynn A. Gurley
Attorney, Agent, or Firm—Willian Brinks Hofer Gilson & Lione

[57] ABSTRACT

A silicon dioxide film and a silicon nitride film are sequentially deposited on an n-type silicon substrate in this order. After the silicon nitride film is selectively removed to form openings, an impurity (boron) for forming a channel stopper is diagonally implanted through the resultant openings. In this case, the direction of the ion implantation, which is projected in a plane perpendicular to the direction of the channel length of a FET in a memory cell region, is 45° tilted with respect to the direction of the normal of the surface substrate, so that implanted boron reaches the end portion of the channel region. Thereafter, LOCOS films are formed and, simultaneously, an impurity (boron) for threshold adjustment is implanted into the respective FET formation regions of the memory cell region and of a peripheral circuit region. This increases the threshold value for the FETs in the memory cell region due to a channel-narrowing effect, thereby minimizing the leakage current in the off state and realizing device miniaturization.

14 Claims, 9 Drawing Sheets

5(CHANNEL STOPPER)

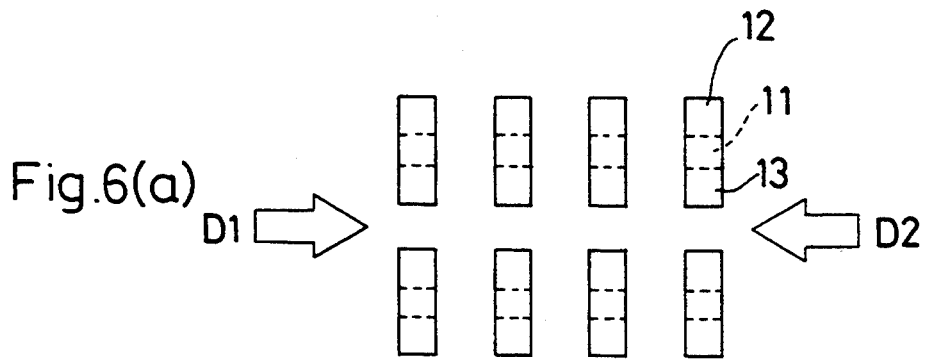
Fig.6(a)
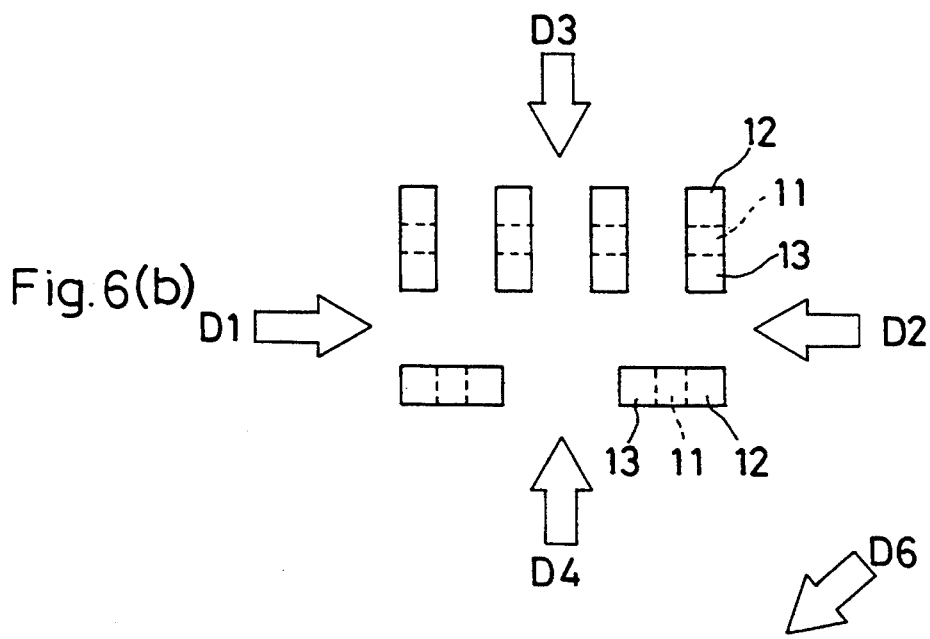
Fig.6(b)
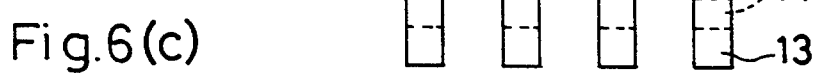
Fig.6(c)
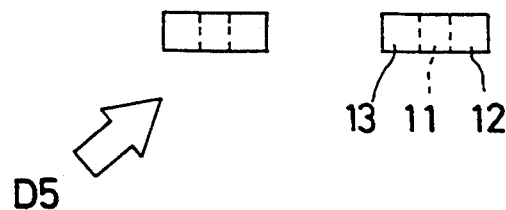

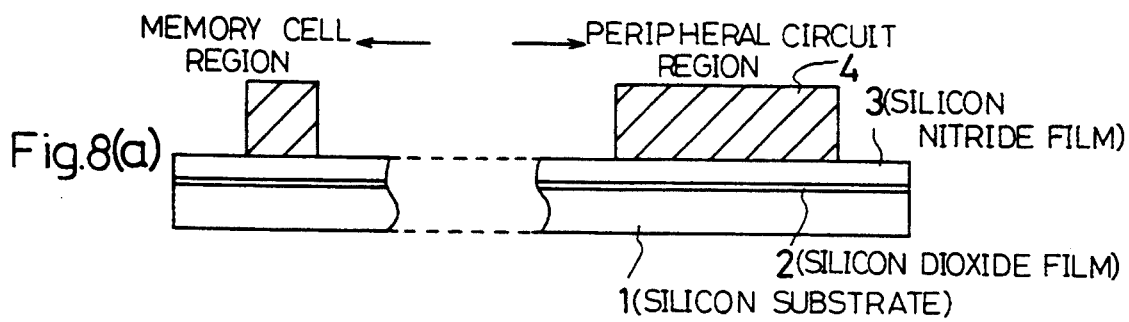
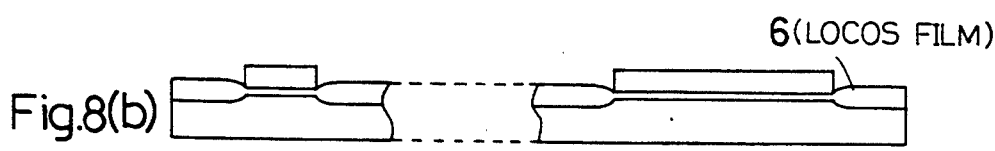
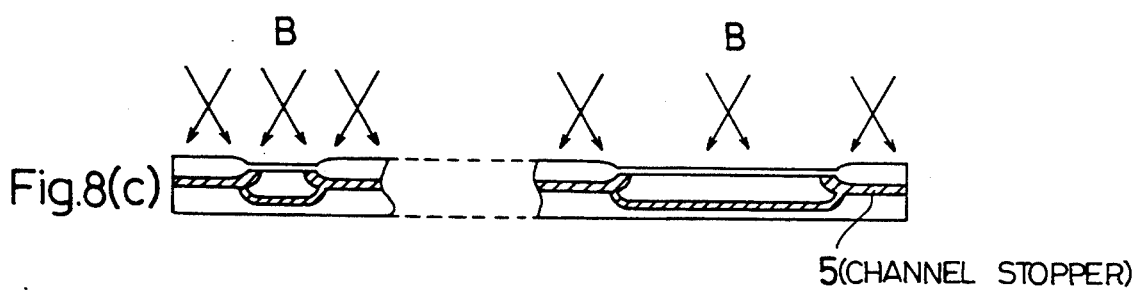
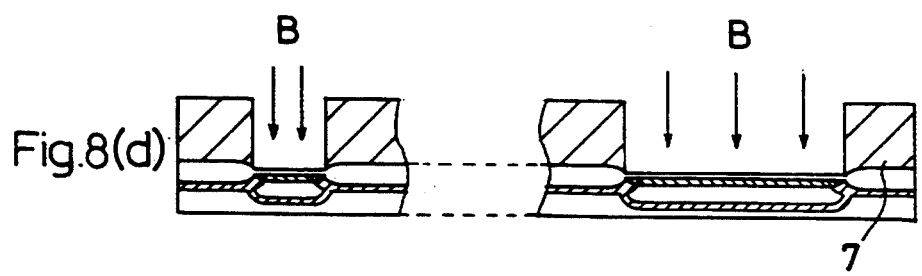

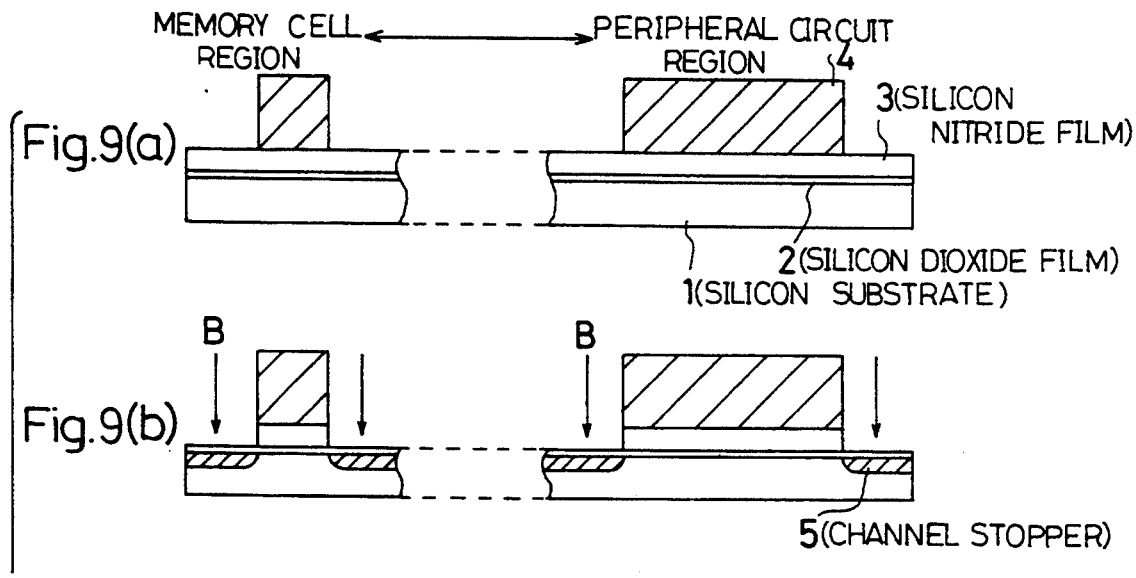
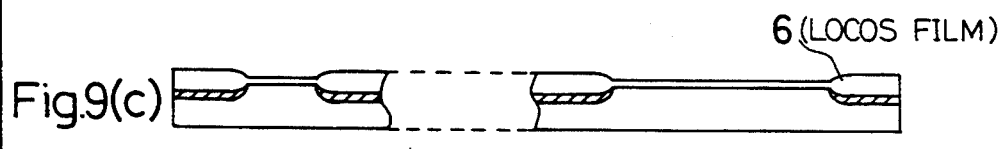
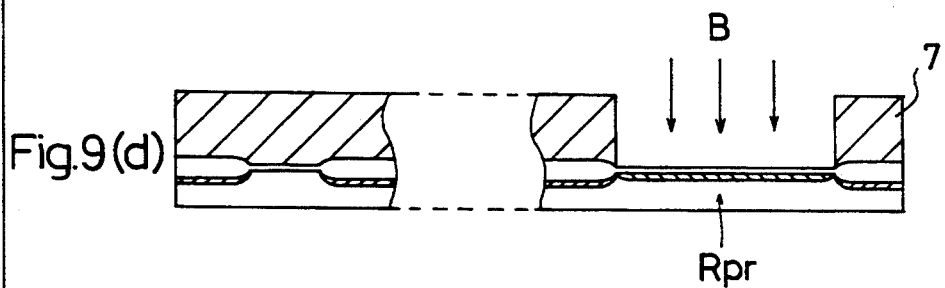
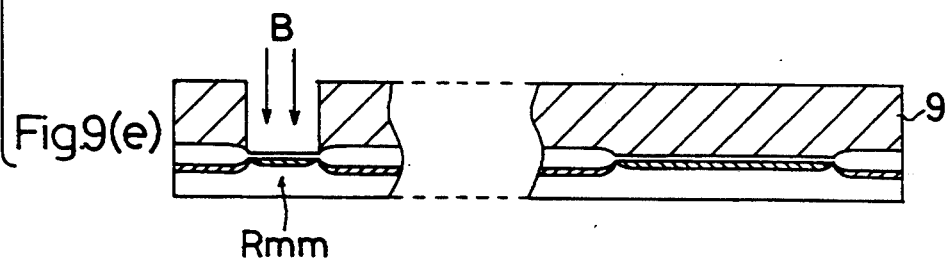

SEMICONDUCTOR FABRICATING METHOD FORMING CHANNEL STOPPER WITH DIAGONALLY IMPLANTED IONS

BACKGROUND OF THE INVENTION

The present invention relates to a method of fabricating a semiconductor device in which FETs are disposed in the memory cell region and peripheral circuit region thereof and, more particularly, to the reduction of process steps for adjusting a threshold value.

As higher-degree integration of a semiconductor is pursued in recent years, the process for adjusting a threshold value or the like is becoming more complicated.

By way of example, a conventional method of fabricating a semiconductor device in which FETs are provided in the memory cell region and peripheral circuit region thereof will be described below with reference to the drawings. FIGS. 9 are cross sections of a semiconductor device provided with a dynamic random access memory (DRAM) of FET structure which is being fabricated according to the conventional method. In the drawing, the memory cell region is on the left side of the substrate and the peripheral circuit region is on the right side thereof.

As shown in FIG. 9(a), a silicon dioxide film 2 is formed to the thickness of 20 nm on the silicon substrate 1 which was previously doped with a p-type impurity. Thereafter, a silicon nitride film 3 which is resistant to oxidation is deposited to the thickness of 160 nm. A photoresist film 4 with openings for future isolations is formed on the surface of the silicon nitride film 3.

Next, as shown in FIG. 9(b), dry etching is performed using $CH_2F_2$ at a flow rate of 30 sccm, $O_2$ at a flow rate of 15 sccm, and He as a coolant at a flow rate of 5 sccm under a gas pressure of 8 Pa with a power of 250 W, so that the silicon nitride film 3 in the openings of the photoresist mask 4 is vertically etched. Then, an impurity boron (B) for forming a channel stopper 5 is implanted into the resulting openings with energy of 80 KeV at a dose of $1.5 \times 10^{13}/cm^2$. After that, the photoresist mask 4 is removed.

Next, as shown in FIG. 9(c), an oxidation process is performed for 100 minutes at 1000° C. so as to form the isolations 6 composed of so-called LOCOS. After that, the silicon nitride film 3 is removed.

Subsequently, as shown in FIG. 9(d), an impurity for threshold adjustment is introduced by ion implantation into a device formation region Rpr of the peripheral circuit region with the use of a photoresist mask 7 with an opening for the device formation region Rpr of the peripheral circuit region. After that, the photoresist mask 7 is removed.

Then, as shown in FIG. 9(e), the impurity for threshold adjustment is introduced by ion implantation into a device formation region Rmm of the memory cell region with the use of a photoresist mask 9. After that, the photoresist mask 9 is removed.

In the case where FETs are provided in the peripheral circuit region and memory cell region, respectively, it is necessary to maintain the threshold for the FET in the peripheral circuit region at a lower value in order to enhance the operating speed thereof. On the other hand, since the data holding property is crucial to the FET in the memory cell region, the leakage current when the power supply is off should be minimized. However, as the channel length is reduced with the miniaturization of the FET, a higher threshold value is required for this purpose.

However, when the impurity is introduced by a single implantation process, the threshold values for the FETs for both regions become equal. Therefore, it becomes necessary to individually perform ion implantations for adjusting the threshold value for the FET in the peripheral circuit region and for adjusting the threshold value for the FET in the memory cell region, which is disadvantageous in that an increased number of steps are required for processing.

SUMMARY OF THE INVENTION

The present invention was achieved based on the fact that channel width of a FET provided in a peripheral circuit region is much wider than the channel width of a FET provided in a memory cell region, though the channel lengths of the FETs provided in the both regions are substantially the same. An object of the present invention is to provide a method of fabricating a semiconductor device in which FETs are disposed in the memory cell region and peripheral region thereof. In the step of implanting ions of an impurity for forming a channel stopper according to the method, the direction of the ion implantation, which is projected in a plane perpendicular to the direction of the channel length of the FET in the memory cell region, is tilted largely with respect to the normal of the substrate surface. Thus, by a single implantation of an impurity, the threshold for the FETs in the peripheral circuit region is adjusted to a lower value and the threshold for the FETs in the memory cell region is adjusted to a higher value, thereby providing a semiconductor device of miniaturized structure with excellent characteristics, while suppressing the increase in cost.

Concretely, the present invention was achieved on the basis of the method of fabricating a semiconductor device being provided with a memory cell region and a peripheral circuit region, each having: at least one FET consisting of a gate electrode, source region, drain region, and channel region lying beneath said gate electrode; an isolation for isolating said FET from the other region; and a channel stopper formed beneath said isolation. The method comprises the steps of: forming said isolations; forming the channel stoppers beneath said isolations; and doping said FETs with an impurity for adjusting the threshold values for the FETs. In said step of forming the channel stoppers, the ion implantation of the impurity is diagonally performed so that the direction of the ion implantation, which is projected in a plane perpendicular to the direction of the channel length of the FET in said memory cell region, is largely tilted with respect to the normal of the substrate surface.

Thus, in the step of forming the channel stopper beneath the isolations, ions of an impurity are diagonally implanted into the future channel region beneath the gate electrode of the FET in the memory cell region, so that the ions of the impurity go beyond the boundary between the device region and the channel region to be introduced into the end portion of the channel region. Since ions of the impurity for forming the channel stopper were implanted into the end portion of the channel region, the impurity concentration there will be further increased by the subsequent implantation of the impurity for threshold adjustment. Consequently, the effective channel width of the FET in the memory cell region is reduced and hence the threshold value is increased, so that the leakage current in the off state can be minimized even when the FET, including the gate electrode, is further miniaturized, thereby providing the satisfactory data holding property.

In the case where the channel length of the FET in the peripheral circuit region and the channel length of the FET in the memory cell region are in parallel directions, the effective channel width of the FET in the peripheral circuit region is also reduced by ion implantation of the impurity for forming the channel stopper, similarly to that of the FET in the memory cell region. However, since the dimensions of the FET in the peripheral circuit are comparatively large, the increase in threshold value due to the reduction of the effective channel width is extremely small, so that the calculating speed is not decreased accordingly.

The above fabrication method can adopt the following preferred embodiments.

In said step of doping said FETs with the impurity for adjusting the threshold values for the FETs, ion implantation of the impurity for adjusting the threshold value for the FET in said memory cell region and ion implantation of the impurity for adjusting the threshold value for the FET in said peripheral circuit region are carried out simultaneously.

Thus, by simultaneously implanting ions of the impurity for threshold adjustment into the memory cell region and into the peripheral circuit region, the threshold value for the FET in the memory cell region can be set higher than the threshold value for the FET in the peripheral circuit region, so that it is possible to miniaturize the FET in the memory cell region and to prevent the lowering of the calculating speed of the FET in the peripheral region. Consequently, the fabrication process is simplified and hence the number of deficient products and the cost can be reduced.

The foregoing step of forming the isolations is carried out by a LOCOS method and, in said step of forming the channel stoppers, ions of said impurity are implanted into the surfaces of the future isolation regions prior to the step of forming the isolations.

Thus, the isolations are formed by a LOCOS method. Since the impurity for forming the channel stopper was previously implanted into the surface regions in which the isolations are to be formed, the previously implanted impurity is diffused to the region beneath the isolations and to the channel region of the FET in the subsequent thermal oxidation process for forming the isolations according to the LOCOS method, so that the channel stopper is formed and the impurity is distributed in such a manner as to increase the threshold value for the channel region.

In the foregoing step of forming the isolations is carried out by a LOCOS method and, in said step of forming the channel stoppers, ion implantation of an impurity is carried out after the formation of the isolations and, at the same time as the ion implantation of the impurity for forming said channel stopper, an impurity for forming punch-through stoppers is implanted with high energy deep into the regions in which the FETs are to be formed, being distant from their surfaces.

Thus, after the formation of the isolations, ions of the impurity for forming the channel stoppers are diagonally implanted with high energy, so that they are introduced into the region immediately beneath the isolations composed of thick LOCOS films without reaching the region deep inside the substrate below the isolations.

In the region in which the FET is to be formed, on the other hand, the impurity is implanted into the region deep inside the semiconductor substrate, so as to form punch-through stoppers. Therefore, the impurity for forming the channel stoppers, the impurity for forming the punch-through stoppers, and the impurity for increasing the threshold value for the FET in the memory cell region can be introduced by a single ion implantation, thereby simplifying the process.

The direction of the ion implantation, which is projected in a plane perpendicular to the directions of the channel lengths of the FETs, is preferably tilted 20° or more with respect to the direction of the normal of the substrate surface. Thus, the difference between the threshold value for the FET in the memory cell region and the threshold value for the FET in the peripheral circuit region is significantly increased.

In the case of performing a rotational ion implant, the direction of the ion implantation, which is projected on the substrate surface, may be sequentially or intermittently changed.

In the case of intermittently change the direction of the ion implantation, which is projected on the substrate surface, a plurality of ion implantations are preferably performed as follows, depending on the arrangement of the directions of the channel lengths of the FETs in the memory cell region.

In the case where the channel lengths of all the FETs in said memory cell region are in parallel directions, two ion implantations are performed in two directions, respectively, so that the directions of the ions to be implanted, which are projected on the substrate surface, are perpendicular to the directions of the channel lengths of the FETs in said memory cell region.

In the case where said memory cell region is provided with at least two FETs, four ion implantations are performed in four directions, respectively, so that the directions of ion implantation, which are projected on the substrate surface, are perpendicular to the directions of the channel lengths of the FETs in said memory cell region.

In the case where said memory cell region is provided with at least two FETs, two ion implantations are performed in two directions, respectively, so that the directions of ion implantation, which are projected on the substrate surface, and the directions of the channel lengths of the FETs in said memory cell region form an angle of 45° therebetween. Thus, the effective channel widths of all the FETs in the memory cell region are reduced by the impurity implantations, for the direction of the ion implantation, which is projected in a plane perpendicular to the direction of the channel length of the FET in the memory cell region, is also largely tilted with respect to the direction of the normal of the substrate surface, so that the same effects as can be obtained from four ion implantations can be obtained from two ion implantations, resulting in the reduced number of process steps.

In the case where the FET in the memory cell region is an n-channel FET, ions of a p-type impurity are implanted in the step of forming the channel stoppers. Since a p-type impurity is implanted into the n-channel FET in order to adjust the threshold voltage, the impurity of the same conductivity is repeatedly implanted into the end portion of the channel region in the two steps, so that the effect of increasing the threshold value can surely be obtained.

In the case where the FET in the memory cell region is a p-channel FET of near-surface channel structure, ions of an n-type impurity are implanted in the step of forming the channel stoppers. Since an n-type impurity is implanted into the p-channel FET of near-surface channel structure in order to adjust the threshold voltage, the impurity of the same conductivity is repeatedly implanted into the end portion of the channel region in the two steps, so that the effect of increasing the threshold value can surely be obtained.

In the process of fabricating a semiconductor, the amount of an impurity and the direction of the ion implantation are determined as follows. That is, there are provided the steps of: determining the threshold value for the FET in the peripheral circuit region; determining the threshold value for the FET in the memory circuit region; determining the amount of an impurity and the direction of ion implantation for forming the channel stoppers in consideration of the isolating function, durability against a breakdown, and the difference between the respective threshold values for the FET in the memory cell region and for the FET in the peripheral circuit region; and determining the amount of an impurity to be implanted for adjusting the respective threshold values for the FET in the memory cell region and for the FET in the peripheral circuit region. This precisely determines the conditions of ion implantation which are required for adjusting the threshold for the FET in the memory cell region to a higher value and the threshold for the FET in the peripheral circuit region to a lower value by simultaneously implanting the impurity for threshold adjustment into the memory cell region and peripheral circuit region.

In the step of determining the amount and direction of ions of the impurity to be implanted for forming the channel stoppers, the amount of ions to be implanted is corrected depending on the angle between the direction of the ion implantation, which is projected in a plane perpendicular to the directions of the channel lengths of the FETs, and the direction of the normal of the substrate surface. Thus, the semiconductor substrate is surely doped with the same amount of impurity as is used in an ordinary ion implantation.

BRIEF DESCRIPTION OF THE DRAWINGS

FIGS. 6(a) to 6(c) are views illustrating the methods of rotational ion implant;

FIGS. 8(a) to 8(d) are cross sections of the substrate which show the transition of the fabrication process according to Example 2; and FIGS. 9(a) to 9(e) are cross sections of the substrate which show the transition of the conventional fabrication process.

DETAILED DESCRIPTION OF THE PREFERRED EMBODIMENTS

Figure 1A:
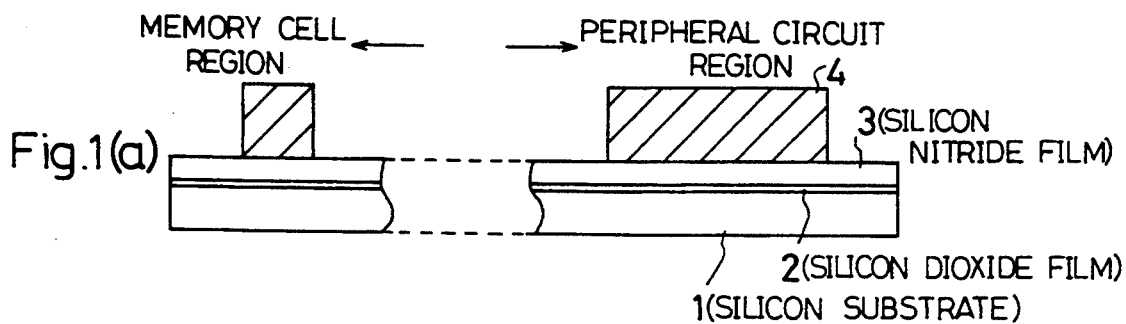
FIGS. 1(a) to 1(d) are cross sections of the substrate which show the transition of the fabrication process according to Example 1.

Referring now to the drawings, the embodiments of the present invention will be described below.

EXAMPLE 1

First, Example 1 will be described with reference to FIGS. 1 and 2. Here, FIG. 2 is a perspective view showing the basic structure of a FET in the memory cell region. Around a device formation region Rmm on a silicon substrate 1 which was doped with a p-type impurity boron, there is formed a LOCOS film 6 to be an isolation for isolating the device formation region Rmm from the other region. Under the LOCOS film 6, a channel stopper 5 is formed by the doping with the p-type impurity boron at a higher concentration than the impurity concentration of the silicon substrate 1, so as to ensure its isolating function. Over the LOCOS film 6 across the central portion of the device formation region Rmm is provided a gate electrode 11 composed of a conductive material such as polysilicon. On the both sides of the gate electrode 11 are formed a drain region 13 and source region 12 (on the opposite side of the drain region 13 with respect to the gate electrode 11, though it is not shown). Namely, a channel region 14 which allows a controlled current to flow is formed in the region beneath the gate electrode 11 near the surface of the silicon substrate 1. The impurity concentration of the channel region 14 is higher than that of the silicon substrate 1 so as to adjust the threshold value. In the drawing, Y represents the direction of the channel length, X represents the direction of the channel width, and Z represents the direction of the normal of the substrate surface, i.e., the direction of the thickness of the substrate. Here, L represents the channel length and W represents the distance from one end to the other end of the LOCOS film 6, i.e., the apparent channel width. However, due to the channel stopper 5 obtained from the doping with the impurity, the channel width which actually allows a current to flow, i.e., the effective channel width Wef is narrower than the apparent channel width W which corresponds to the interval between the LOCOS films 6.

FIGS. 1(a) to 1(d) are cross sections of the substrate which show the transition of the fabrication process for a semiconductor device. The cross sections are taken in the Z-X plane which is perpendicular to the direction Y of the channel length shown in FIG. 2. In FIGS. 1(a) to 1(d), the memory cell region is on the left side and the peripheral circuit region is on the right hand.

Figure 2:
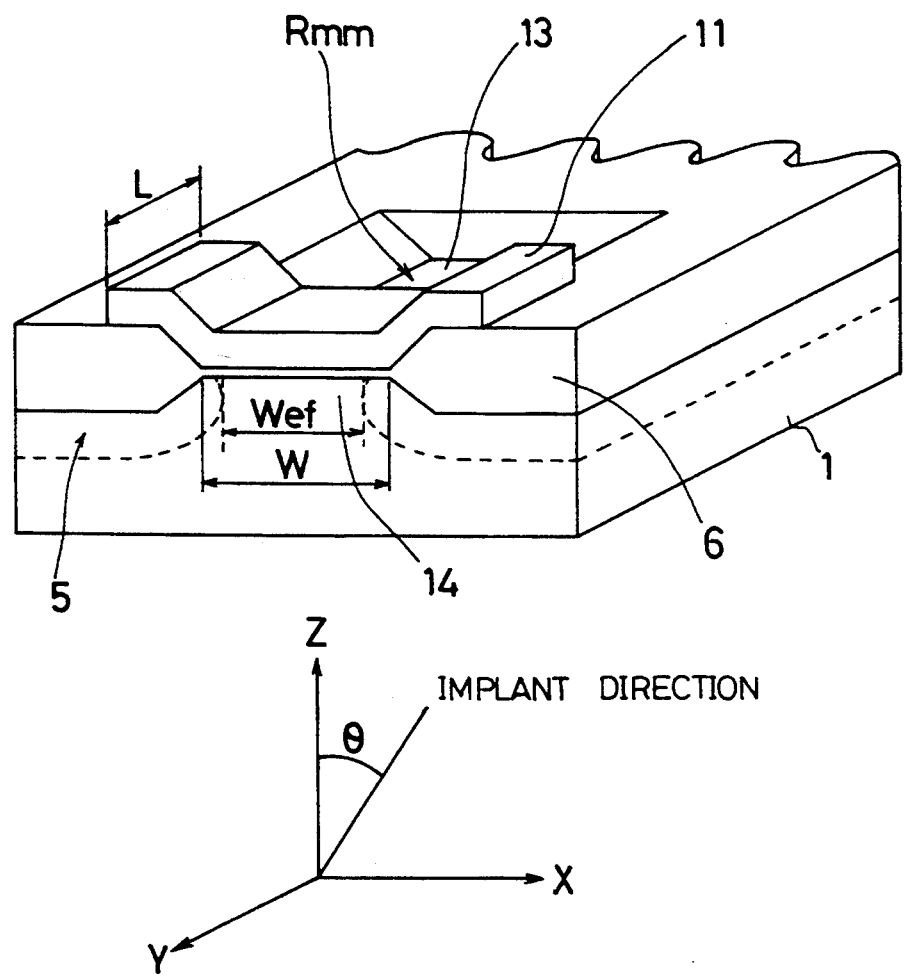
FIG. 2 is a perspective view showing the three-dimensional structure of a FET.

First, as shown in FIG. 1(a), a silicon dioxide film 2 is formed to the thickness of 20 nm on a silicon substrate 1 which was doped with a p-type impurity. On the resulting silicon dioxide film 2 is deposited a silicon nitride film 3 to the thickness of 160 nm. Next, a photoresist film 4 with openings for future isolations is formed on the surface of the silicon nitride film 3.

Figure 1B:
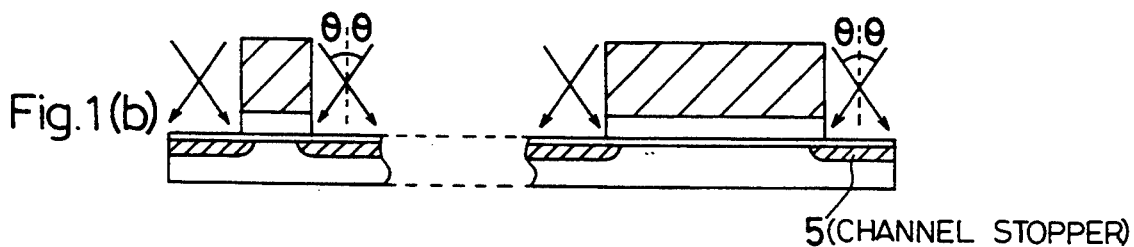

Next, as shown in FIG. 1(b), dry etching is performed using $CH_2F_2$ at a flow rate of 30 sccm, $O_2$ at a flow rate of 15 sccm, and He as a coolant at a flow rate of 5 sccm under a gas pressure of 8 Pa with an RF power of 250 W, so that the silicon nitride film 3 in the openings of the photoresist mask 4 is etched selectively and vertically. Subsequently, boron (B) as an impurity for forming a channel stopper 5 is introduced in the two directions by a rotational ion implant into the regions exposed in the preceding etching process. The conditions used here are: implant energy=113 KeV; dose $=1.5 \times 10^{13}/cm^2$; and tilt angle $\theta=45°$. After that, the photoresist mask 4 is removed. In this case, as shown in FIG. 2, the ion implantation is diagonally performed so that the angle $\theta$ between the direction of the ion implantation, which is projected in a plane (Z-X plane) perpendicular to the direction of the channel length and the direction of the normal of the substrate surface becomes 45°.

Figure 1C:
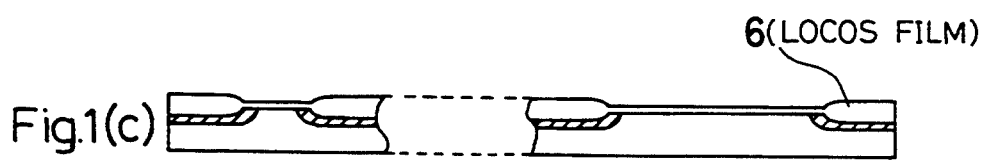

Next, as shown in FIG. 1(c), a thermal treatment is performed for 100 minutes at 1000° C. so as to oxidize silicon through the openings of the silicon nitride film 3, thereby forming the LOCOS film 6 serving as the isolation.

Figure 1D:
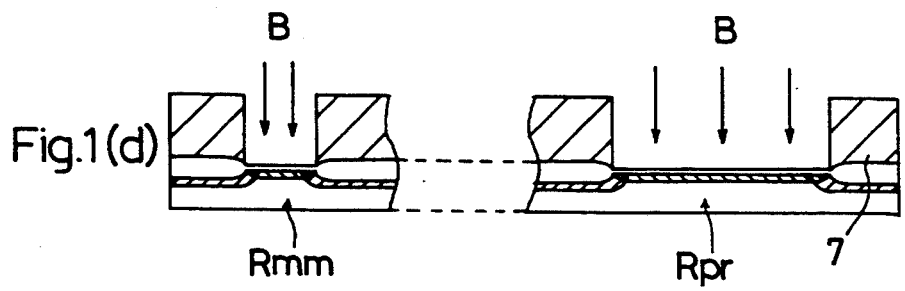

Then, as shown in FIG. 1(d), a photoresist mask 7 with openings for the device formation regions Rmm and Rpr of the memory cell region and of the peripheral circuit region are formed over the LOCOS film 6. Subsequently, boron (B) serving as an impurity having the same conductivity as that of the silicon substrate 1 is implanted at a time through the openings of the photoresist mask 7. After that, the photoresist mask 7 is removed.

In the present embodiment, the ion implantation of the impurity (boron) for forming the channel stopper is performed diagonally at an implant angle of 45° in the process shown in FIG. 1(b). As a result, the impurity (boron) for forming the channel stopper is implanted not only into the region in which the LOCOS film 6 is to be formed, but also into the device formation regions Rmm and Rrp. Specifically, ions of the impurity (boron) for forming the channel stopper go beyond the end portions of the LOCOS film 6 to be introduced into the end portion of the channel region 14 beneath the gate electrode 11 of FIG. 2. Moreover, since the end portion of the channel region 14 is also subjected to the ion implantation of the impurity (boron) for threshold adjustment shown in FIG. 1(d) in addition to the ion implantation of the impurity (boron) for forming the channel stopper shown in FIG. 1(b), its impurity concentration and resistance become extremely high, so that it does not substantially allow the channel current to flow. Consequently, the effective channel width Wef is reduced, and the channel-narrowing effect increases the threshold value Vt. The difference (W−Wef) between the apparent channel width W and effective channel width Wef is the same both in the memory cell region and in the peripheral circuit region. However, since the channel width W is different in the memory cell region and in the peripheral circuit region due to the difference in size of their FETs (in the present embodiment, W=0.7 μm in the memory cell region and W=10 μm in the peripheral circuit region), the channel-narrowing effect is exerted on the respective threshold values Vt to different degrees.

Figure 3A:
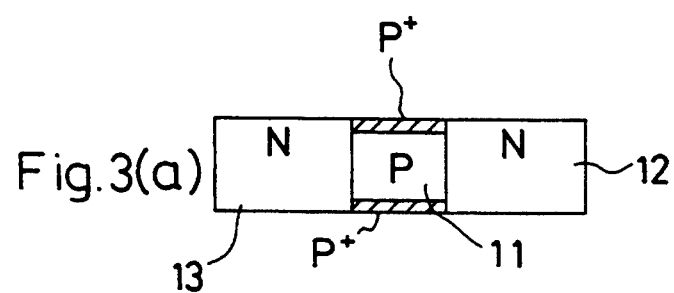
FIGS. 3(a) and 3(b) are plan views showing the difference in channel-narrowing effect corresponding to the difference in size between the FET in the memory cell region and the FET in the peripheral circuit region.
Figure 3B:
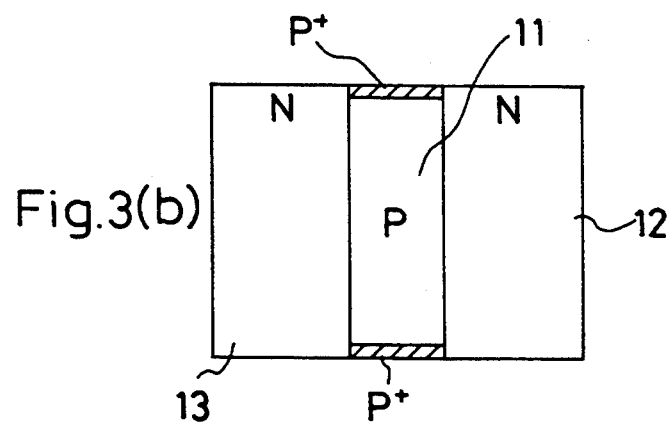

FIG. 3(a) shows the plane dimensions of the FET in the memory cell region and FIG. 3(b) shows the plane dimensions of the FET in the peripheral circuit region. In the memory cell region, the channel length Lm is 0.7 μm and the apparent channel width Wm is 0.7 μm. In the peripheral circuit region, on the other hand, the channel length Lp is 0.8 μm and the apparent channel width Wp is 10 μm. Since the apparent width Wm is comparatively narrow with the FET in the memory cell region, the threshold value VTm is largely changed due to the channel-narrowing effect resulting from the diffusion of the impurity for forming the channel stopper. On the other hand, the FET of the peripheral circuit region is larger and hence the channel width Wp is wider, so that the diffusion of the impurity for forming the channel stopper does not reach the central portion of the channel, resulting in the extremely slight increase of the threshold voltage VTp due to the channel-narrowing effect. Therefore, with a single ion implantation process which induces different degrees of channel-narrowing effect on the memory cell region and on the peripheral circuit region, it is possible to reduce the threshold value VTp of the FET in the peripheral circuit region so as to perform the high-speed operation, while increasing the threshold value VTm of the FET in the memory cell region so as to minimize the leakage current in the off state.

Figure 4:
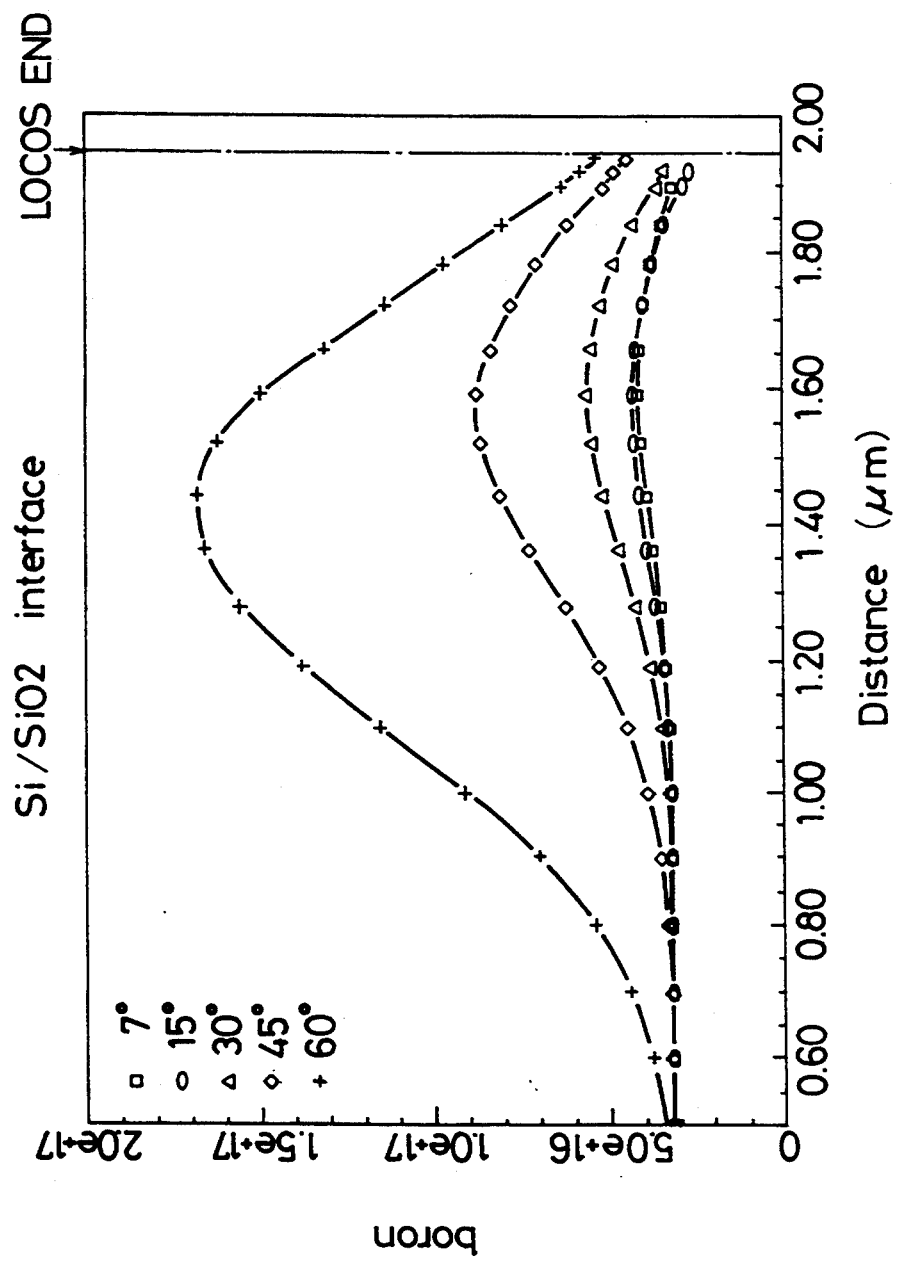
FIG. 4 is a view showing simulated profiles of impurity concentration when the angle for ion implantation is varied.

FIG. 4 shows simulated profiles of impurity boron concentration in a cross section taken in the direction of the channel width, which are obtained by using different implant angles of 7°, 15°, 30°, 45°, and 60°. In the ion implantation of the impurity for forming the channel stopper, the implant energy is increased as the implant angle $\theta$ is becoming larger for the purpose of correcting the amounts of decrease in implant energy due to the different angles. In the drawing, the peak value of the concentration is observed at a point inside the channel region, which is distant from the end portion of the channel by a specified value. Hence, it will be understood that the region which actually allows the channel current to flow is limited to the region around the center of the channel and that the effective width Wef is reduced accordingly.

Figure 5:
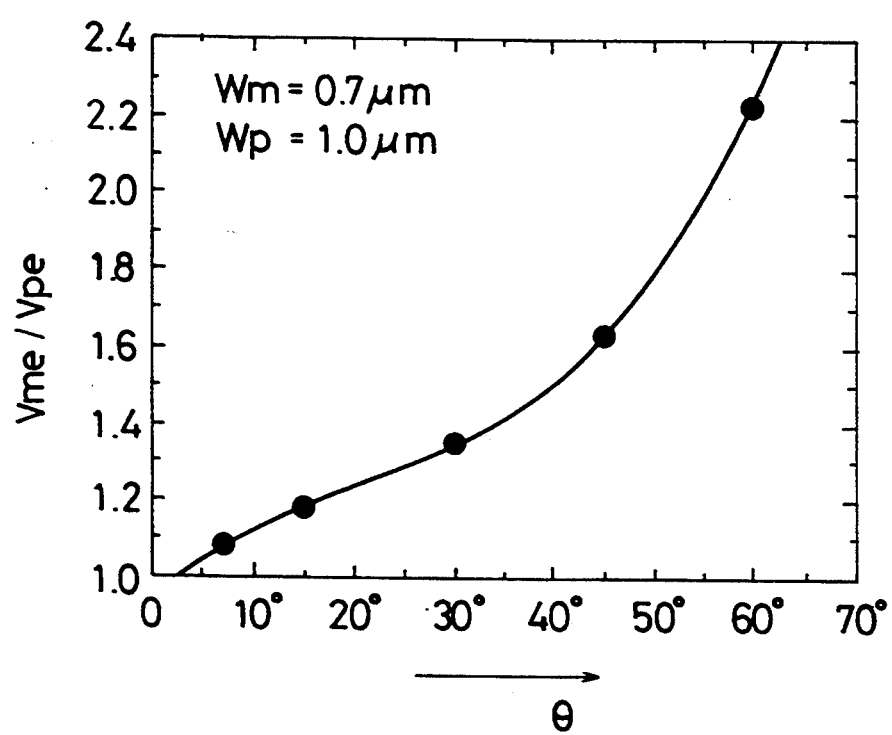
FIG. 5 is a view showing a simulated variation of the ratio of the threshold value for the FET in the memory cell region to the threshold value for the FET in the peripheral circuit region in response to the variation of the angle for ion implantation.

FIG. 5 shows a simulated variation of the ratio of the threshold value VTm of the FET in the memory cell region to the threshold value VTp of the FET in the peripheral circuit region in the case of varying the implant angle $\theta$. Here, the threshold value VTp of the FET in the peripheral circuit region is set at 0.5 V. As shown in the drawing, the threshold value VTm of the FET in the memory cell region becomes higher as the implant angle $\theta$ becomes larger. At an implant angle of the order of 45°, the ratio to the threshold value VTp for the FET in the peripheral circuit region becomes about 1.6, which means that the difference ΔVT between the two threshold values becomes about 0.3 V.

Although the impurity (boron) for forming the channel stopper is implanted at an angle of 45° in the present embodiment, the present invention is not limited thereto. However, as can be appreciated from FIGS. 4 and 5, the difference ΔVT between the threshold values becomes sufficiently large when the implant angle $\theta$ is 20° or more, so that the effect of the present invention can be fully exerted. The implant angle $\theta$ is defined as the angle between the implant direction projected in a plane (Z-X plane of FIG. 2) perpendicular to the direction of the channel length and the direction of the normal of the substrate surface (direction Z of FIG. 2). It is not necessary for the implant direction projected on the substrate surface to be perpendicular to the direction of the channel length (direction Y of FIG. 2).

Although boron ions are implanted as the impurity for forming the channel stopper of the n-type FET in the foregoing embodiment, the present invention is not limited thereto. For example, a p-type impurity such as boron difluoride ions can be used instead. In a p-type FET, ions of an n-type impurity such as phosphorus are commonly implanted as the impurity for forming the channel stopper, while boron ions are implanted as the p-type impurity for threshold adjustment. In an n-channel FET of near-surface channel structure, however, ions of a p-type impurity such as phosphorus are implanted as the impurity for threshold adjustment, so that the reduced size of the FET, which is characteristic of the near-surface channel structure, combined with the improved characteristics of the miniaturized FET, can exert a desirable effect when the present invention is applied.

Below, a method of rotational implant in the ion implantation of the impurity for forming the channel stopper will be described with reference to FIGS. 6(a) to 6(c), which show a variety of implant directions in plan views.

FIG. 6(a) shows the case in which the channel lengths of all the FETs in the memory cell region are in parallel directions, similarly to above Example 1. With such an arrangement, it is sufficient to perform two ion implantations in the two directions D1 and D2, respectively, so that the implant directions projected on the substrate surface are perpendicular to the direction Y of the channel lengths. However, since an apparatus for ion implantation is fixed in practice, the processes are performed by rotating the substrate.

The present invention is not limited to an embodiment in which a plurality of ion implantations are performed. It is also applicable to an embodiment in which a single ion implantation is performed, for a single ion implantation can exert the channel-width-narrowing effect if it is performed diagonally.

FIG. 6(b) shows the case in which at least two FETs are provided so that the directions of their channel lengths are perpendicular to each other. According to the method shown in the drawing, four ion implantations are performed in the four directions D1, D2, D3, and D4, respectively, so that the implant directions projected on the substrate surface are perpendicular to either of the directions of the respective channel lengths of the FETs. Thus, the channel widths of all the FETs can be reduced. However, in the case where the channel lengths of all the FETs in the memory cell region are in parallel directions, the channel lengths of all the FETs in the peripheral circuit region are in parallel directions, and the directions of the channel lengths of the FETs in the memory cell region are perpendicular to the directions of the channel lengths of the FETs in the peripheral circuit region, ion implantations in the two directions may sufficiently be performed in such a manner that the implant directions projected on the substrate surface are perpendicular only to the directions of the channel lengths of the FETs in the memory cell region, for the object of the present invention can be attained provided that the channel width WTm is reduced.

FIG. 6(c) shows the case where at least two FETs are provided so that the directions of their channel lengths are perpendicular to each other. In this case, it is sufficient to perform ion implantations in the two directions D5 and D6 so that the respective angles between the implant directions projected on the substrate surface and the directions of the channel lengths of the FETs become 45°. Here, the three-dimensional directions are selected for ion implantation so that each of the implant directions projected in a plane perpendicular to the channel lengths of the FETs is considerably tilted with respect to the direction of the normal. Thus, with the two ion implantations, it is possible to reduce the channel widths of the FETs disposed in the memory cell region even when the directions of the channel lengths of the FETs are perpendicular to each other, so that, according to the method shown above in FIG. 6(b), the number of ion implantations can be reduced.

Figure 7A:
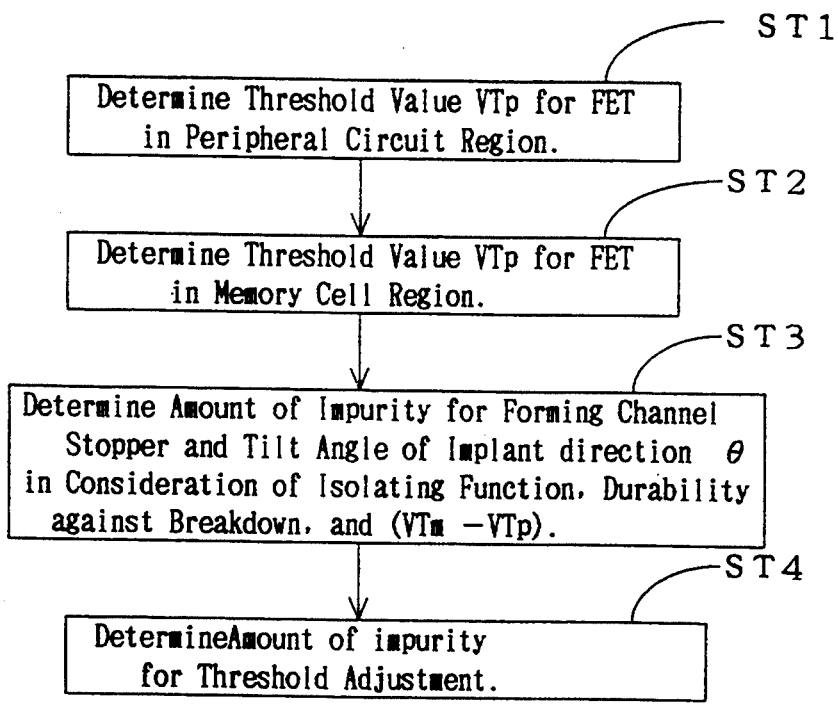
FIGS. 7(a) and 7(b) are flow charts showing the procedures for determining the amounts and directions of the ions to be implanted in accordance with the fabrication method of the present invention and with the conventional fabrication method, respectively.

Below, a method of determining the conditions of impurity ion implantation will be described with reference to FIGS. 7(a) and 7(b). FIG. 7(a) shows a method of determining the conditions of impurity ion implantation in the fabrication process according the foregoing embodiment and FIG. 7(b) shows a method of determining the conditions of impurity ion implantation in the conventional fabrication process.

As shown in FIG. 7(a), in the foregoing embodiment, the threshold value VTp for the FETs in the peripheral circuit region is determined in Step ST1 and the threshold value VTm for the FETs in the memory cell region is determined in Step ST2. Subsequently in Step ST3, the amount of the impurity to be implanted for forming the channel stopper is determined in consideration of the amount of the dopant impurity necessary to ensure the insulating function and the amount of the dopant impurity necessary to ensure the durability against a breakdown. After that, in the same Step ST3, the tilt angle $\theta$ between the direction in which the impurity for forming the channel stopper is implanted and the direction of the normal is determined in consideration of the difference (VTm − VTp) between the threshold values for the respective FETs in the memory cell region and in the peripheral circuit region. In this case, a correction is made by increasing the implant energy depending on the tilt angle because the net amount of the ions implanted becomes smaller as the tilt angle becomes larger, even when the implant energy is the same. Finally, in Step ST4, the amount of impurity to be implanted for simultaneously adjusting the threshold values for the FETs in the peripheral circuit region and in the memory cell region is determined.

Figure 7B:
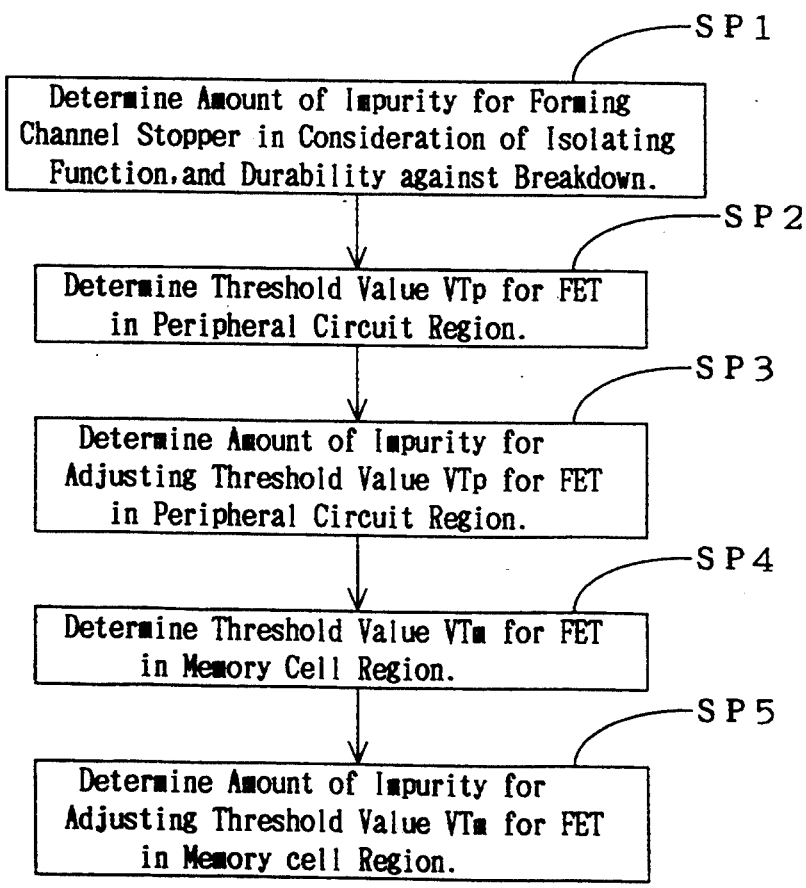

In the conventional fabrication process, on the contrary, the conditions of ion implantation are determined according to the procedure shown in FIG. 7(b). That is, in Step SP1, the amount of ions of the impurity to be implanted for forming the channel stopper is determined in consideration of the amount of the dopant impurity necessary to ensure the isolating function and the amount of the dopant impurity to ensure the durability against a breakdown. In Step SP2, the threshold value VTp for the FETs in the peripheral circuit region is determined. In Step SP3, the amount of the impurity to be implanted for adjusting the threshold value for the FETs in the peripheral circuit region is determined. Subsequently in Step SP4, the threshold value VTm for the FETs in the memory cell region is determined. Finally in Step SP5, the amount of the impurity to be implanted for adjusting the threshold value for the FETs in the memory cell region is determined.

By contrast to the method of determining the conditions of ion implantation in the conventional fabrication process, the method of determining the conditions of ion implantation in the fabrication process of the present invention considers the difference (VTm−VTp) between the threshold value VTm for the FETs in the memory cell region and the threshold value VTp for the FETs in the peripheral circuit region in determining the amount of impurity and the angle for implant, thereby precisely determining the implant conditions required for adjusting the threshold for the FETs in the memory cell region to a higher value and the threshold for the FETs in the peripheral circuit region to a lower value with a simultaneous implantation of the impurity for threshold adjustment.

EXAMPLE 2

FIG. 8 shows the method of fabricating a semiconductor device in accordance with Example 2.

First, as shown in FIG. 8(a), a silicon dioxide film 2 is formed to the thickness of 20 nm on a p-type silicon substrate 1. After that, a silicon nitride film 3 is deposited thereon to the thickness of 160 nm. Then, a photoresist is applied and patterned to form a photoresist mask 4. Thereafter, dry etching is performed by using $CH_2F_2$ at 30 sccm, $O_2$ at 15 sccm, and He as a coolant at 5 sccm under a gas pressure of 8 Pa with an RF power of 250 W, so that the silicon nitride film 3 is vertically etched. After that, the photoresist mask 4 is removed.

Subsequently, as shown in FIG. 8(b), an oxidation process is performed for 100 minutes at 1000° C., so as to form a LOCOS film 6. After that, the silicon nitride film is removed.

Then, as shown in FIG. 8(c), ion implantation of boron is performed, from above the semiconductor substrate with the LOGOS film 6 and silicon dioxide film 2 formed thereon, under the conditions of 225 KeV, $3.0 \times 10^{12}/cm^2$ and at the implant angle of 45°, so as to form a channel stopper 5.

Finally, as shown in FIG. 8(d), a photoresist mask 7 is formed, and boron serving as the impurity for adjusting the threshold value for the FETs in the peripheral circuit region and as the impurity for adjusting the threshold value for the FETs in the memory cell region is implanted at a time into the both FET formation regions through the openings of the photoresist mask 7. After that, the photoresist mask 7 is removed.

According to Example 2, boron as the impurity for forming the channel stopper is implanted at 225 Kev, at a dose of $3.0 \times 10^{12}/cm^2$ and at an implant angle of 45°, followed by a single ion implantation of the impurity for threshold adjustment, thereby adjusting the threshold value VTp to about 0.55 V and the threshold value VTm to 0.85 V with the same effect as that of Example 1. In addition, ion implantation of the impurity for forming the channel stopper and ion implantation of the impurity for forming a punch-through stopper can be performed simultaneously in a single process step, so that the number of process steps and hence the fabrication cost can be reduced.

Although the ion implantation of boron as the impurity for forming the channel stopper is performed at an implant angle $\theta$ of 45°, the implant angle $\theta$ is not limited to 45°, similarly to above Example 1.

We claim:

1. A method of fabricating a semiconductor device being provided with a memory cell region and a peripheral circuit region, each having: at least one FET consisting of a gate electrode, source region, drain region, and channel region lying beneath said gate electrode; an isolation for isolating said FET from the other region; and a channel stopper formed beneath said isolation, said method comprising the steps of:

forming said isolation;

forming the channel stoppers beneath said isolations; and doping said FETs with an impurity for adjusting the threshold values for the FETs, wherein, in said step of forming the channel stoppers, the ion implantation of the impurity is diagonally performed so that the direction of the ion implantation, which is projected in a plane perpendicular to the direction of the channel length of the FET in said memory cell region, is tilted with respect to the normal of the substrate surface, and wherein, in said step of doping said FETs with the impurity for adjusting the threshold values for the FETs, ion implantation of the impurity for adjusting the threshold value for the FET in said memory cell region and ion implantation of the impurity for adjusting the threshold value for the FET in said peripheral circuit region are carried out simultaneously.

2. A method of fabricating a semiconductor device according to claim 1, wherein said step of forming the isolations is carried out by a LOCOS method and, in said step of forming the channel stoppers, ions of said impurity are implanted into the surfaces of the future isolation regions prior to the step of forming the isolations.

3. A method of forming a semiconductor device according to claim 1, wherein said step of forming the isolations is carried out by a LOCOS method and, in said step of forming the channel stoppers, ion implantation of an impurity is carried out after the formation of the isolations and, at the same time as the ion implantation of the impurity for forming said channel stopper, an impurity for forming punch-through stoppers is implanted with high energy deep into the regions in which the FETs are to be formed, being distant from their surfaces.

4. A method of fabricating a semiconductor device according to claim 1, wherein, in said step of forming the channel stoppers, the direction of the ion implantation, which is projected in a plane perpendicular to the directions of the channel lengths of the FETs, is tilted 20° or more with respect to the direction of the normal of the substrate surface.

5. A method of fabricating a semiconductor device according to claim 1, wherein said step of forming the channel stoppers includes the step of rotating the direction of ion implantation to sequentially rotate the substrate in the horizontal plane with respect to the direction of the ion implantation, which is projected on the substrate surface.

6. A method of fabricating a semiconductor device according to claim 1, wherein said step of forming the channel stoppers include the step of rotating the direction of ion implantation to intermittently rotate the substrate in the horizontal plane with respect to the direction of the ion implantation, which is projected on the substrate surface.

7. A method of fabricating a semiconductor device according to claim 6, wherein the channel lengths of all the FETs in said memory cell region are in parallel directions and, in said step of forming the channel stoppers, two ion implantations are performed in two directions, respectively, so that the directions of ion implantation, which are projected on the substrate surface, are perpendicular to the directions of the channel lengths of the FETs in said memory cell region.

8. A method of fabricating a semiconductor device according to claim 6, wherein said memory cell region is provided with at least two FETs, the direction of the channel length of one FET being perpendicular to the direction of the channel length of the other FET, and, in said step of forming the channel stoppers, four ion implantations are performed in four directions, respectively, so that the directions of ion implantation, which are projected on the substrate surface, are perpendicular to the directions of the channel lengths of the FETs in said memory cell region.

9. A method of fabricating a semiconductor device according to claim 6, wherein said memory cell region is provided with at least two FETs, the direction of the channel lengths of one FET being perpendicular to the direction of the channel length of the other FET, and, in said step of forming the channel stopper, two ion implantations are performed in two directions, respectively, so that the directions of ion implantation, which are projected on the substrate surface, and the directions of the channel lengths of the FETs in said memory cell region form an angle of 45° therebetween.

10. A method of fabricating a semiconductor device according to claim 1, wherein the FET in the memory cell region is an n-channel FET and ions of a p-type impurity are implanted in the step of forming the channel stoppers.

11. A method of fabricating a semiconductor device according to claim 1, wherein the FET in the memory cell region is a p-channel FET of near-surface channel structure and ions of an n-type impurity are implanted in the step of forming the channel stoppers.

12. A method of fabricating a semiconductor device according to claim 1, further comprising the steps of:

determining the threshold value for the FET in the peripheral circuit region;

determining the threshold value for the FET in the memory cell region;

determining the amount of an impurity and the direction of the ion implantation for forming the channel stoppers in consideration of the isolating function, durability against a breakdown, and the difference between the respective threshold values for the FET in the memory cell region and for the FET in the peripheral circuit region;

doping a region where channel stopper is to be formed with an impurity according to the condition determined by the step of determining the amount of an impurity and the direction of the ion implantation for forming the channel stoppers;

determining the amount of an impurity to be implanted for adjusting the respective threshold values for the FET in the memory cell region and for the FET in the peripheral circuit region; and doping the FET in the memory cell region and the FET in the peripheral circuit region with an impurity simultaneously according to the condition determined by the step of determining the amount of an impurity to be implanted for adjusting the respective threshold values.

13. A method of fabricating a semiconductor device being provided with a memory cell region and a peripheral circuit region, each having: at least one FET consisting of a gate region, source region, drain region, and channel region which is placed beneath said gate region; an isolation for isolating said FET from the other region; and a channel stopper formed beneath said isolation, said method comprising the steps of:

determining the threshold value for the FET in the peripheral circuit region;

determining the threshold value for the FET in the memory circuit region;

determining the amount of an impurity and the direction of the ion implantation for forming the channel stoppers in consideration of the isolating function, durability against a breakdown, and the difference between the respective threshold values for the FET in the memory cell region and for the FET in the peripheral circuit region;

doping a region where a channel stopper is to be formed with an impurity according to the condition determined by the step of determining the amount of an impurity and the direction of the ion implantation for forming the channel stoppers;

determining the amount of an impurity to be implanted for adjusting the respective threshold values for the FET in the memory cell region and for the FET in the peripheral circuit region; and doping the FET in the memory cell region and the FET in the peripheral circuit region with an impurity simultaneously according to the condition determined by the step of determining the amount of an impurity to be implanted for adjusting the respective threshold values.

14. A method of fabricating a semiconductor device according to claim 13 or 12, wherein, in the step of determining the amount of an impurity and the direction of the ion implantation for forming the channel stoppers, the amount of ions to be implanted is corrected depending on the angle between the implant direction, which is projected in a plane perpendicular to the directions of the channel lengths of the FETs, and the direction of the normal of the substrate surface.

* * * * *